(12) United States Patent
Vyvoda

(10) Patent No.: US 7,511,352 B2
(45) Date of Patent: Mar. 31, 2009

(54) RAIL SCHOTTKY DEVICE AND METHOD OF MAKING

(75) Inventor: Michael A. Vyvoda, San Jose, CA (US)

(73) Assignee: Sandisk 3D LLC, Milpitas, CA (US)

( * ) Notice: Subject to any disclaimer, the term of this patent is extended or adjusted under 35 U.S.C. 154(b) by 1003 days.

(21) Appl. No.: 10/440,882

(22) Filed: May 19, 2003

(65) Prior Publication Data

US 2004/0232509 A1    Nov. 25, 2004

(51) Int. Cl.
*H01L 27/095* (2006.01)
*H01L 27/112* (2006.01)

(52) U.S. Cl. .............. 257/473; 257/481; 257/486; 257/910; 257/E29.338; 257/E31.065; 438/131; 438/600

(58) Field of Classification Search ........... 257/209, 257/473, 481, 485, 486, 530, 910, 594, E23.147, 257/E27.05, E29.338, E31.065; 438/131, 438/600
See application file for complete search history.

(56) References Cited

U.S. PATENT DOCUMENTS

| | | | |
|---|---|---|---|
| 4,646,266 A * | 2/1987 | Ovshinsky et al. ......... 365/105 |
| 4,999,318 A * | 3/1991 | Takahumi et al. ........... 438/309 |
| 5,432,729 A | 7/1995 | Carson et al. |
| 5,559,732 A | 9/1996 | Birge |
| 5,835,396 A | 11/1998 | Zhang |
| 5,915,167 A | 6/1999 | Leedy |
| 6,034,882 A | 3/2000 | Johnson et al. |
| 6,236,587 B1 | 5/2001 | Gudesen et al. |
| 6,486,065 B2 * | 11/2002 | Vyvoda et al. .............. 438/690 |
| 6,661,691 B2 * | 12/2003 | Fricke et al. .................. 365/63 |
| 6,664,639 B2 * | 12/2003 | Cleeves ....................... 257/774 |
| 2003/0062594 A1 * | 4/2003 | Chen .......................... 257/530 |
| 2003/0173643 A1 * | 9/2003 | Herner ....................... 257/530 |
| 2004/0108573 A1 * | 6/2004 | Herner ....................... 257/530 |
| 2004/0151024 A1 * | 8/2004 | Fricke et al. ................. 365/177 |

OTHER PUBLICATIONS

U.S. Appl. No. 10/185,508, filed Jun. 27, 2002, Cleeves.
U.S. Appl. No. 10/326,470, filed Dec. 19, 2002, Herner et al.

* cited by examiner

Primary Examiner—Matthew E Warren
(74) Attorney, Agent, or Firm—Eschweiler & Associates, LLC

(57) ABSTRACT

A monolithic three dimensional memory array comprising Schottky diodes components separated by antifuses is disclosed. The Schottky diodes are vertically oriented and disposed on alternating levels. Those on odd levels are "right-side-up" with antifuse over the metal, and those on even levels are "upside down" with metal over the antifuse. Both antifuses are preferably grown oxides.

45 Claims, 12 Drawing Sheets

RAIL SCHOTTKY DEVICE AND METHOD OF MAKING

BACKGROUND OF THE INVENTION

The invention relates to a monolithic three dimensional memory array in which the memory cells comprise portions of Schottky diodes in a memory array comprising rails. The memory cells are located at rail intersections. Two types of Schottky diodes are used on alternating memory levels.

In existing monolithic three-dimensional memory arrays in which a memory cell comprises portions of a P-N diode separated by an antifuse, programming a memory cell by rupturing its antifuse may in some circumstances cause unintended programming of adjacent cells. The mechanism by which this unintended programming happens is prevented by the use of Schottky diodes. Some difficulties exist in fabricating a Schottky-only monolithic three-dimensional memory array, however.

There is a need, therefore, for an economical method of making a robust Schottky-only monolithic three-dimensional memory array.

SUMMARY OF THE INVENTION

The present invention is defined by the following claims, and nothing in this section should be taken as a limitation on those claims. In general, the invention is directed to a monolithic three dimensional memory array comprising memory cells comprising portions of first-type and second-type Schottky diodes, the portions separated by an antifuse. The first-type Schottky diodes are rightside-up, and the second-type Schottky diodes are upside-down, but in both in preferred embodiments the antifuses comprise grown oxides.

One aspect of the invention provides for a nonvolatile memory array comprising a first memory cell comprising portions of a first-type Schottky diode and a second memory cell comprising portions of a second-type Schottky diode, wherein portions of the first-type Schottky diode comprise a first metal and the portions of the second-type Schottky diode comprise a second metal different from the first metal.

Another aspect of the invention provides for a monolithic three dimensional memory array comprising a plurality of incipient first-type Schottky diodes, each comprising a first metal which is a silicide, and a plurality of incipient second-type Schottky diodes, each comprising a second metal different from the first metal.

Yet another aspect of the invention provides for a memory cell comprising a layer of lightly doped or intrinsic silicon, an antifuse in contact with the silicon, and a layer of titanium nitride in contact with the antifuse.

A preferred embodiment provides for a method for making a monolithic three dimensional memory array comprising forming a plurality of substantially parallel first rails comprising first metal layers adjacent to first antifuses, forming a plurality of substantially parallel second rails over the first rails, said second rails comprising: first layers of lightly doped or intrinsic silicon; and second layers of lightly doped or intrinsic silicon over the first silicon layers; and forming a plurality of substantially parallel third rails over the second rails, said third rails comprising second metal layers adjacent to second antifuses, wherein the second metal of the second metal layers is different from the first metal of the first metal layers.

Another embodiment provides for a monolithic three dimensional memory array formed over a substrate comprising odd and even levels of memory above a substrate, wherein odd memory levels comprise portions of first-type Schottky diodes comprising a first metal; and even memory levels comprise portions of second-type Schottky diodes comprising a second metal different from the first metal.

A preferred embodiment provides for a memory array comprising portions of a first-type Schottky diode comprising a first semiconductor portion over a first metal portion, the first semiconductor portion and first metal portion separated by a first antifuse; and portions of a second-type Schottky diode comprising a second metal portion over a second semiconductor portion, the second metal portion and the second semiconductor portion separated by a second antifuse, wherein both antifuses are grown.

Other preferred embodiments are provided, and each of the preferred embodiments can be used alone or in combination with one another.

The preferred embodiments will now be described with reference to the attached drawings.

DETAILED DESCRIPTION OF THE INVENTION

Figure 1A:
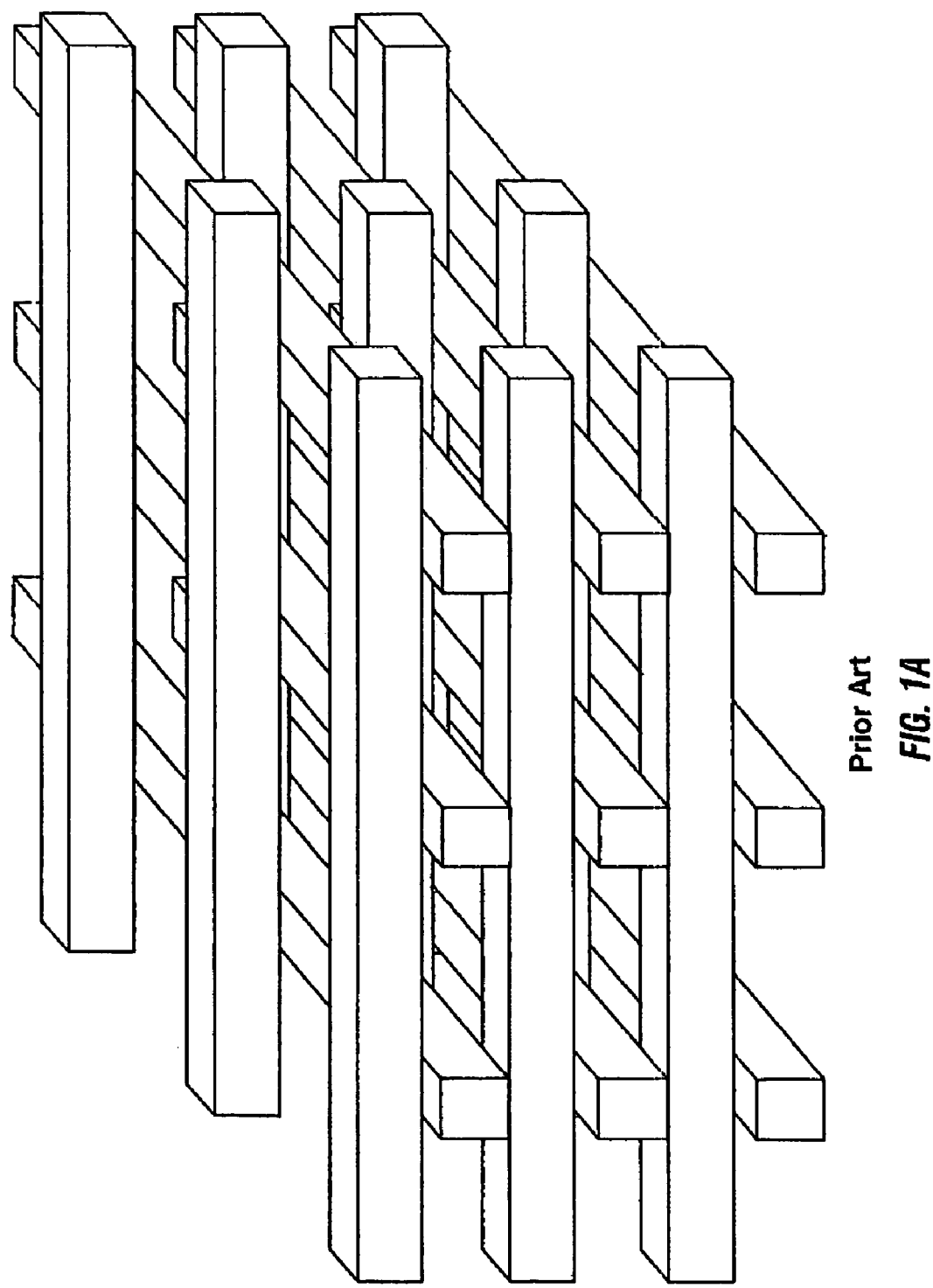
FIGS. 1a and 1b illustrate rail and pillar configurations of monolithic three dimensional memories.
Figure 1B:
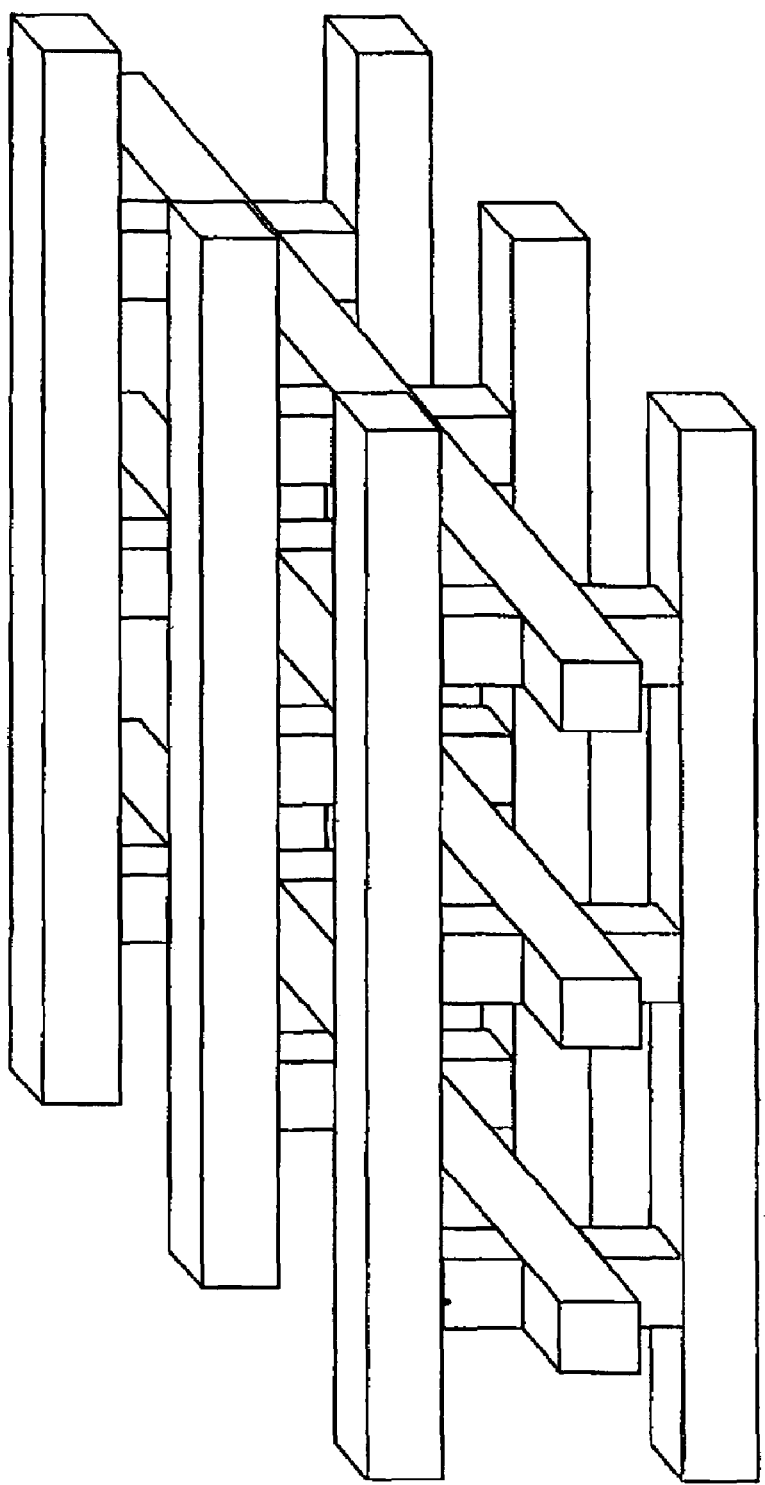

Existing monolithic three dimensional memories comprise memory cells which comprise vertically oriented portions of P-N diodes. The diode portions can be separated by an antifuse, or can be in contact as intact diodes but isolated from an array conductive line by an antifuse. Examples are Johnson et al., U.S. Pat. No. 6,034,882, "Vertically stacked field programmable nonvolatile memory and method of fabrication"; Johnson, U.S. Pat. No. 6,525,953, "Vertically stacked field programmable nonvolatile memory and method of fabrication"; Knall et al., U.S. Pat. No. 6,420,215, "Three Dimensional Memory Array and Method of Fabrication"; and Vyvoda et al., U.S. patent application Ser. No. 10/185,507, "Electrically Isolated Pillars in Active Devices," filed Jun. 27, 2002, all of which are assigned to the assignee of the current invention and are hereby incorporated by reference. In some such memory arrays, the memory cells are arranged in a cross-point architecture. Memory cells may reside at the intersections of rails, as in FIG. 1a, or in pillars that are located at rail intersections, as in FIG. 1b.

In general, "rail" devices are easier to fabricate than "pillar" devices. Fewer masking steps are required, and etch steps tend to be simpler. In rail memory arrays made up of P-N diode portions in which the diode portions are made of semiconductor material, however, there is some risk that, when a memory cell is programmed, neighboring cells may be inadvertently programmed as well.

Figure 2A:
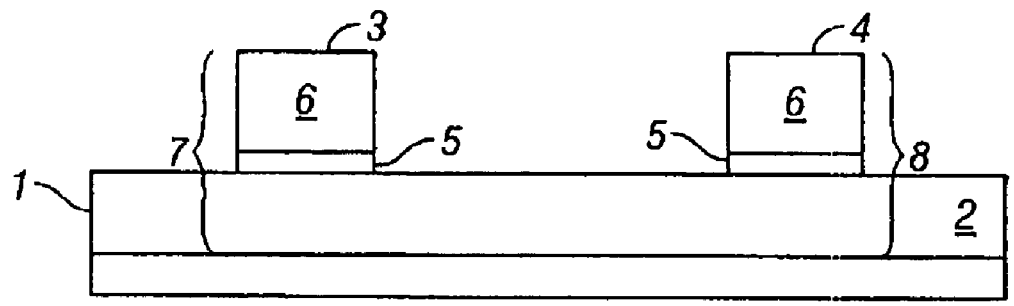
FIGS. 2a and 2b illustrate unintentional programming of neighboring cells in rail memories.

FIG. 2a illustrates a portion of a rail memory. Rail 1 comprises a layer 2 of lightly doped n-type semiconductor material, while rails 3 and 4, which are substantially perpendicular to rail 1, comprise an antifuse layer 5 and heavily doped p-type semiconductor layer 6. In memory cells 7 and 8, the lightly doped n-type layer 2, antifuse layer 5 and heavily doped p-type layer 6 comprise an incipient P-N diode, which will become a diode when the antifuse is ruptured, causing the cell to be programmed.

To program memory cell 7, at the intersection of rails 1 and 3, a positive voltage is applied to rail 3 and a negative voltage to rail 1. The high voltage across antifuse 5 in memory cell 7 will rupture the antifuse, programming the cell. To avoid programming memory cell 8 at the same time, a negative voltage is applied to rail 4, so no high voltage exists across the antifuse layer 5 of memory cell 8.

Figure 2B:
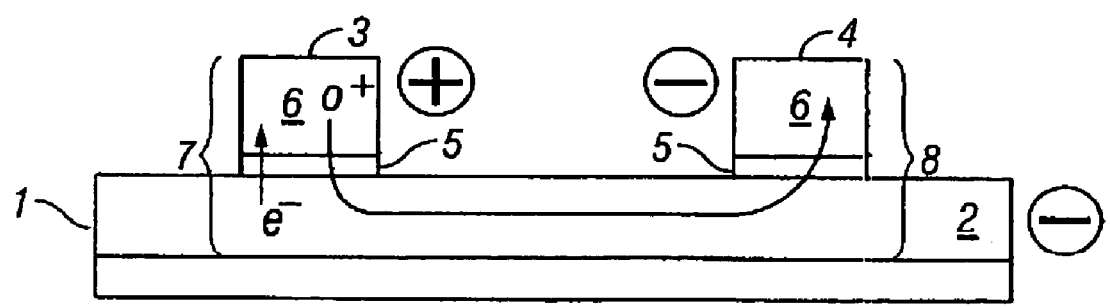

As shown in FIG. 2b, the voltage across memory cell 7 causes electrons to travel from n-type layer 2 to p-type layer 6 in memory cell 7. At the same time, holes travel the opposite direction, from p-type layer 6 to n-type layer 2. The holes are attracted by the negative charge applied to rail 4, and there is some risk they may rupture or partially rupture antifuse layer 5 in memory cell 8, causing that cell to be inadvertently programmed. Such inadvertent programming can be called "write disturb."

The risk of disturbing adjacent cells when programming a memory cell can be avoided by replacing P-N diodes with Schottky diodes. Schottky diodes are majority-carrier devices; thus when voltage is applied to program a memory cell only electrons cross and rupture the antifuse. Thus there is no hole flow to cause write disturb, and no risk of inadvertent programming of neighboring cells.

Figure 3A:
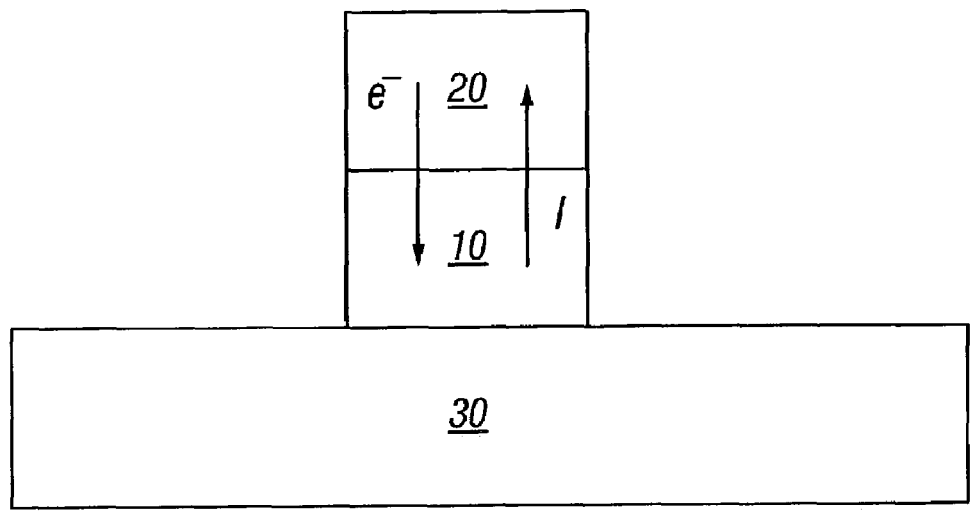
FIGS. 3a and 3b show rightside-up and upside-down Schottky diodes.
Figure 3B:
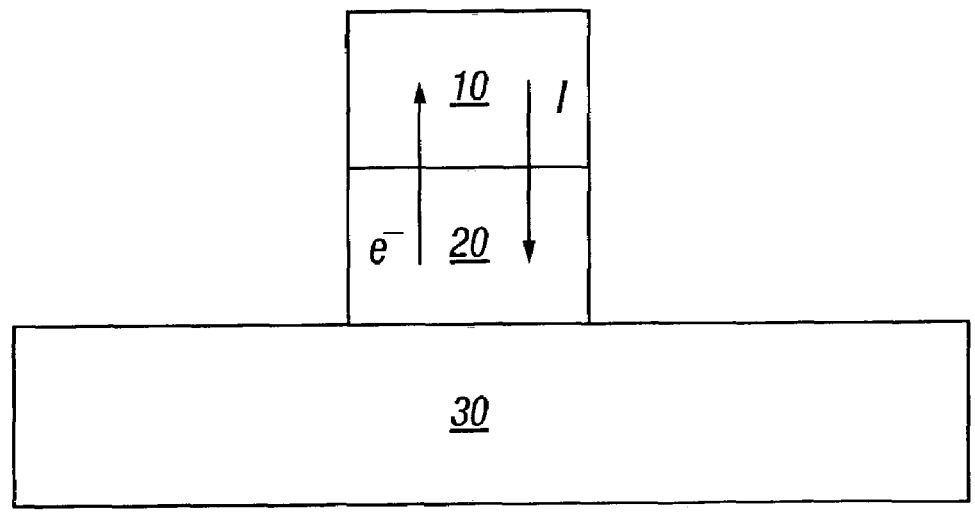

The challenge, then, is to build a monolithic three dimensional memory array in which the memory cells are vertically oriented Schottky devices. To maximize density of the memory array, it is advantageous for some Schottkys to be "rightside-up" while others are "upside-down." A Schottky diode, consisting of a metal layer 10 and a lightly doped or undoped semiconductor layer 20, is considered to be rightside-up when, as in FIG. 3a, the semiconductor layer 20 is above the metal layer 10, and the direction of current flow is up, away from substrate 30, when a positive voltage is applied on 10 relative to 20. Electron flow, which is in the opposite direction, is shown as well. A Schottky diode comprising the same layers is upside-down when, as in FIG. 1b, the metal layer 10 is above the semiconductor layer 20, and the direction of current flow is down, toward a substrate 30.

The memory cells used in the present invention have an antifuse between the two Schottky diode portions. As in FIGS. 4a and 4b, an antifuse 40 is interposed between the metal layer 10 and the semiconductor layer 20. Such a configuration, with an antifuse at the diode junction, will be called a junction antifuse Schottky diode. Each configuration presents some challenges in fabrication.

Figure 4A:
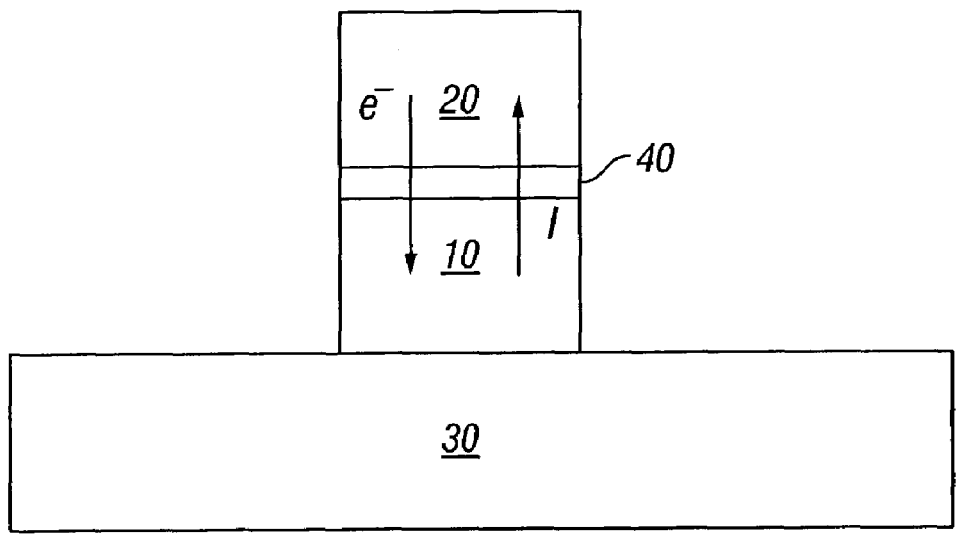
FIGS. 4a and 4b illustrate portions of Schottky diodes separated by antifuses.
Figure 4B:
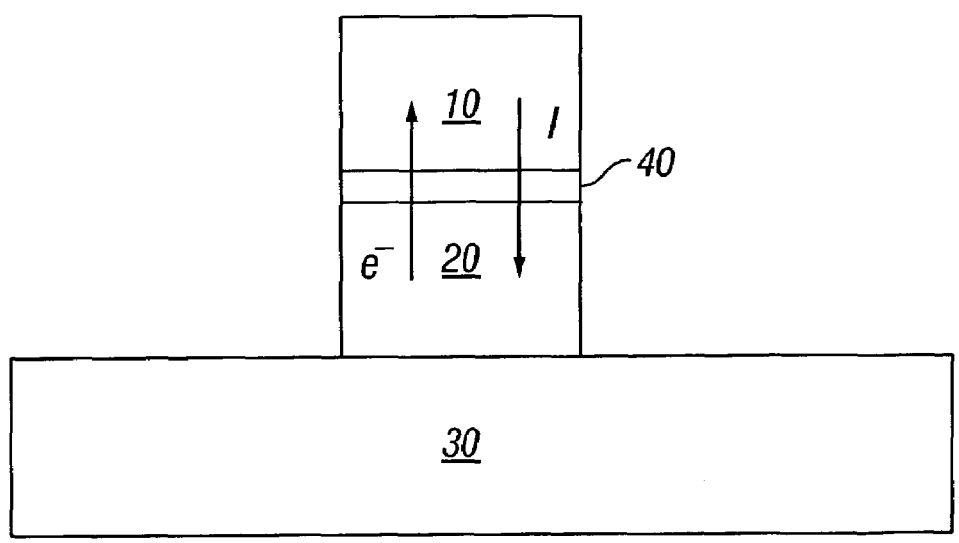

In an upside-down junction antifuse Schottky diode, as in FIG. 4b, the semiconductor layer 20 is formed first, followed by the antifuse 40, followed by the metal layer 10. Formation of a semiconductor layer is well known. Many combinations of semiconductors and antifuses can be used, but, silicon, of course, is widely used for many semiconductor applications, and one advantageous technique for forming an antifuse on a silicon layer is to grow a layer of silicon oxide, preferably by thermal oxidation, creating a high-quality antifuse. Next a metal is formed atop the antifuse. The metal should be chosen such that it can be deposited without damaging the antifuse, which may be very thin; such that its Schottky barrier height with the semiconductor 20 is sufficient to produce a Schottky diode when the antifuse is ruptured; and such that, if the antifuse is a grown oxide, the metal does not consume the oxide.

In a rightside-up junction antifuse Schottky diode, as in FIG. 4a, the metal layer 10 is formed first, followed by the antifuse 40, followed by the semiconductor layer 20. Using conventional materials and techniques, the antifuse 40 must be deposited on metal layer 10 because it cannot be grown. In general, a thermally grown oxide produces a higher quality antifuse, with lower leakage, than a deposited antifuse. Embodiments of the present invention use a diode structure disclosed in Herner, U.S. patent application Ser. No. 10/095, 962, "Silicide-Silicon Oxide-Semiconductor Antifuse Device and Method of Making," filed Mar. 13, 2002, which application is hereby incorporated by reference in its entirety, that allows an antifuse to be grown on a metal, providing the metal is an appropriate silicide. This novel combination of components allows for a Schottky-only rail memory using only grown antifuses.

A silicon oxide "grown" on a silicon-containing surface is one in which a portion of the underlying silicon-containing surface is converted to silicon oxide by exposing the surface to an oxygen-containing ambient. In contrast to a grown silicon oxide layer, a "deposited" silicon oxide layer is formed on a surface by providing silicon and oxygen atoms to the surface. For example, a silicon oxide layer is deposited by chemical vapor deposition (CVD) or sputtering.

Silicon oxide can be stoichiometric silicon dioxide ($SiO_2$) or silicon and oxygen in some other ratio.

A metal and a semiconductor separated by an antifuse which become a Schottky diode when the antifuse is ruptured can also be termed an incipient Schottky diode.

Structure

The structure of preferred embodiments of the Schottky rail device of the present invention will now be described in detail. Not all elements described here need exist, and additional elements may be included.

For simplicity, the description that follows will refer to the use of silicon, which is the preferred semiconductor material to be used in embodiments of the present invention. It will be understood, however, that other suitable semiconductor materials could be used instead.

Figure 5:
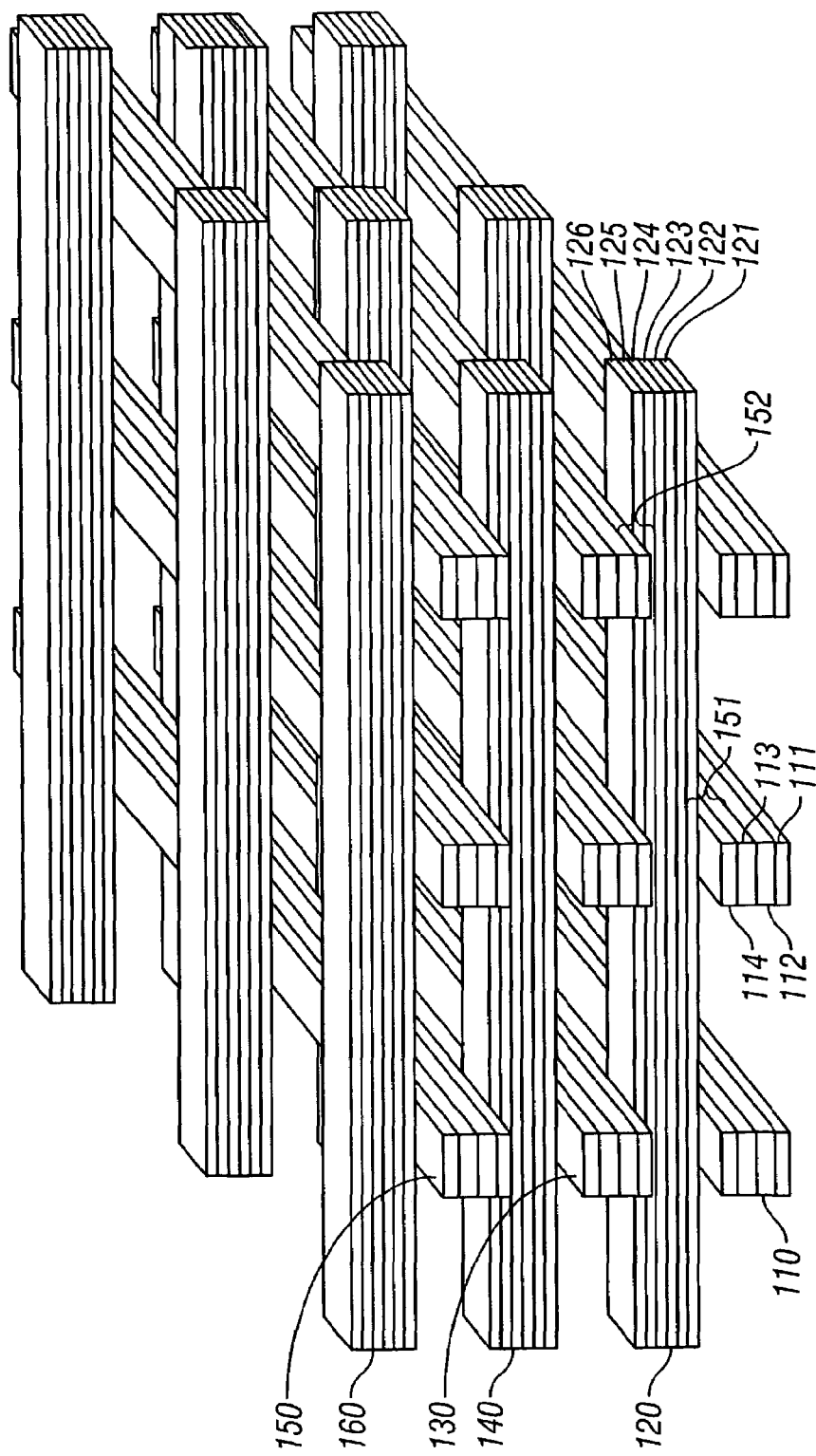
FIG. 5 shows a three dimensional rail array comprising Schottky diodes according to the present invention.

A preferred embodiment consists of alternating pluralities of wordline rails and bitline rails as shown in FIG. 5. The two types of rails making up the memory are referred to as wordline rails and bitline rails for convenience, but the distinction is arbitrary. In this figure the wordline rails of levels 110, 130, and 150 all comprise the same layers, 111, 112, 113, and 114. The bitline rails of levels 120, 140, and 160 also comprise the same layers, in this case 121, 122, 123, 124, 125, and 126. Each level is a plurality of substantially parallel rails at substantially the same height above the substrate 100.

Wordline layer 111 can be any metal that will not consume an adjacent oxide and that will form a Schottky diode when paired with a semiconductor. The Schottky barrier height between the metal and the semiconductor is preferably between 0.3 and 2 electron volts, more preferably between 0.3 and 0.75 electron volts. Metals that can be advantageously used for this layer are titanium nitride, tantalum nitride, or tungsten nitride, most preferably titanium nitride. Layer 112 is heavily doped silicon. Layer 113 is a metal, and is further a silicide, preferably cobalt silicide. It is preferably different from the metal of layer 111. Layer 114 is an antifuse, preferably a grown oxide, preferably silicon oxide.

Bitline layer 121 is lightly doped or intrinsic silicon. Layer 122 is heavily doped silicon. Layer 123 is any suitable conductor, preferably a layer of titanium nitride on a layer of titanium silicide. Layer 124 is heavily doped silicon. Layer 125 is lightly doped or intrinsic silicon. Layer 126 is an antifuse, preferably a grown oxide, preferably silicon oxide.

The term "heavily doped" refers to an n-type or p-type semiconductor material having a charge carrier concentration of more than about $10^{18}$ per cubic cm, for example $10^{20}$ per cubic cm. The term "lightly doped" refers to an n-type or p-type semiconductor material having a charge carrier concentration of less than about $10^{18}$ per cubic cm, for example $10^{17}$ per cubic cm.

It will be seen that each instance of silicide layer 113, antifuse layer 114, and lightly doped or intrinsic silicon layer 121 forms a first memory cell comprising portions of a first-type Schottky diode 151, which, in this case, is a rightside-up junction antifuse Schottky diode. In the first-type Schottky diode, when the antifuse has been ruptured and these diode portions function as a Schottky diode, current will flow up, away from the substrate. Further, each instance of lightly doped or intrinsic silicon layer 125, antifuse layer 126, and titanium nitride layer 111 forms a second memory cell comprising portions of a second-type Schottky diode 152, which, in this case, is an upside-down junction antifuse Schottky diode. In the second-type Schottky diode, when the antifuse has been ruptured and these diode portions function as a Schottky diode, current will flow down, toward the substrate.

These first memory cells, comprising portions of first-type Schottky diodes, exist wherever wordline rails 110 and bitline rails 120 intersect, forming a first memory level over a substrate. The second memory cells, comprising portions of second-type Schottky diodes, exist wherever bitline rails 120 and wordline rails 130 intersect, forming a second memory level over the first memory level.

Similarly, third memory cells, comprising portions of first-type Schottky diodes, exist wherever wordline rails 130 intersect bitline rails 140, forming a third memory level; and fourth memory cells, comprising portions of second-type Schottky diodes, exist wherever bitline rails 140 intersect wordline rails 150. In short, the memory is made up of odd and even memory levels. In the illustrated embodiment, odd memory levels comprise portions of first-type Schottky diodes, while even memory levels comprise portions of second-type Schottky diodes.

Regarding conductivity type of the silicon layers, lightly doped or intrinsic layer 121 and heavily doped layer 122 must share the same conductivity type, which may be either p-type or n-type. Similarly, heavily doped layer 124 and lightly doped or intrinsic silicon layer 125 must share the same conductivity type, which may be either p-type or n-type. Either conductivity type may be used, as long as the result, after the antifuse is ruptured, is a Schottky diode; that is, as long as the contact between the metal and the lightly doped layer is rectifying. N-type silicon is used more frequently than p-type in Schottky diodes. The term "lightly doped or intrinsic silicon" is used because for many deposition techniques, polysilicon deposited with no added dopant has defects which render it slightly n-type.

The bottom level of wordline rails in the array, with no bitline below it, may comprise different layers, if desired. Specifically, since the layers below silicide layer 113 in the bottom level of wordline rails make up no part of any Schottky diode, those layers may be different from those in the other wordline rails. Similarly, the top level of wordline or bitline rails can also comprise different layers.

In FIG. 5, in a preferred embodiment, a plurality of first rails are wordline rails 110. These first rails are over the substrate and extend in a first direction. They may be directly on the substrate, or other layers may intervene. Over these first rails are a plurality of second rails, which are bitline rails 120. The second rails extend in a second direction different from the first direction. Over the second rails are third rails, which are wordline rails 130. The third rails extend in the first direction. Over the third rails are fourth rails, which are bitline rails 140. The fourth rails extend in the second direction. The wordlines and bitlines can be alternately stacked in this fashion, one atop the other, to form a monolithic three dimensional array of rails.

Method of Making

Although the structure described above can be created by any means known in the art, a preferred method of making the present invention will be disclosed. Preferred dimensions, materials, and techniques will be provided, but it will be apparent to the skilled practitioner that these details may be varied, supplemented, or omitted while the results remain within the scope of the invention.

Formation of the memory begins with a substrate. This substrate can be any semiconducting substrate known in the art, such as single crystal silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer may be formed over the substrate. The insulating layer can be silicon oxide, silicon nitride, Si—C—O—H film, or any other suitable insulating material. The insulating layer may or may not be present, and additional layers may be present as well.

Figure 6A:
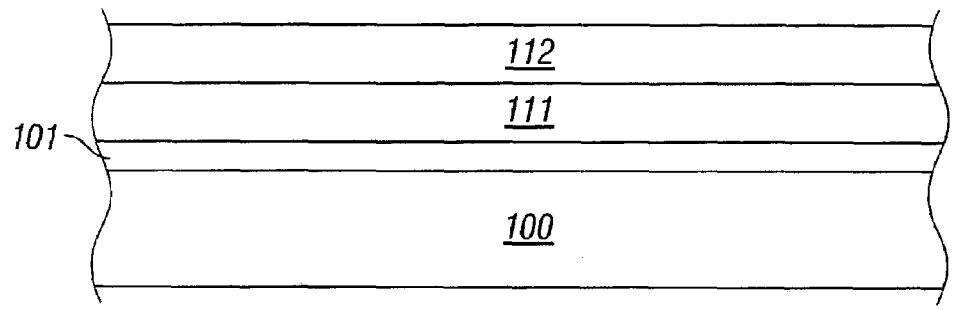
FIGS. 6a through 6f illustrate stages of fabrication of the memory of the present invention.

In this description, the first rails formed are wordline rails. As noted earlier, the first rails, which overlie the substrate, can have a composition different from those of wordline rails that overlie bitline rails, with memory cells at the intersection. In this description, though, for simplicity, the first rails, which are wordline rails, will have the same composition as wordline rails that overlie bitline rails. Turning to FIG. 6a, a conductive layer 111 is deposited over a substrate 100 and a dielectric layer 101. Layer 111 can be any conductor that adheres to dielectric layer 101 and does not damage it; for example, if dielectric layer 101 is silicon oxide, the material of conductive layer 111 must not reduce silicon oxide; layer 111 is preferably titanium nitride, tantalum nitride, or tungsten nitride, more preferably titanium nitride. Conductive layer 111 can be deposited by any method known in the art. If 111 is titanium nitride, it can be deposited by any CVD process, physical vapor deposition (PVD) process such as sputtering, or an atomic layer deposition (ALD) process. In one embodiment, the titanium nitride material is deposited by a sputtering process. Conductive layer 111 can comprise one conductive layer only, or more than one. In the first rail, with no underlying rail, conductive layer 111 can be omitted. Similarly, if layer 111 is included in a first rail with no underlying rail, there is no requirement that it not reduce silicon oxide.

Semiconductor layer 112 is formed over conductive layer 111. Semiconductor layer 112 is any semiconductor material, but is preferably heavily doped polycrystalline silicon, known as polysilicon. This layer can be formed by any deposition and doping method known in the art. The silicon can be deposited and then doped, but is preferably doped in situ. In a preferred embodiment, this layer can range from about 30 to 800 nm thick, preferably 100 to 250 nm, most preferably 150 to 200 nm thick. The dopant is preferably an n-type dopant, preferably phosphorus, though other dopants can be used.

Figure 6B:
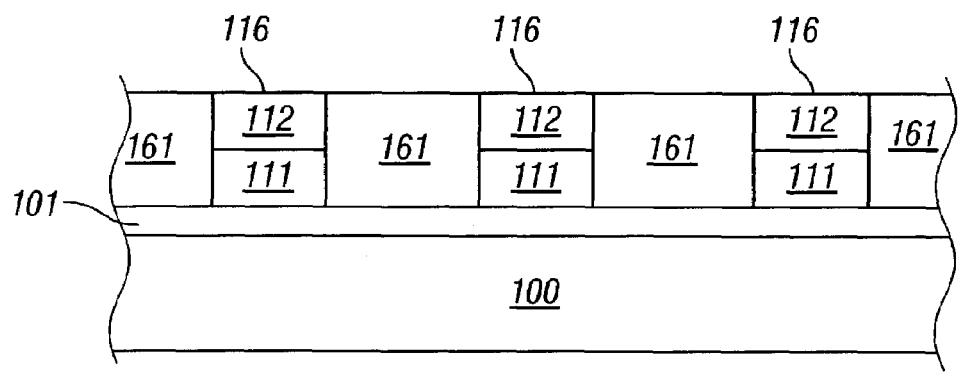

Next layers 111 and 112 are patterned, for example using photoresist, and etched using any known wet or dry etching process into substantially parallel metal/polysilicon lines 116 extending in a first direction, and the photoresist is removed, for example by ashing. Insulating fill layer 161 is deposited over and between the lines 116. Fill layer 161 is any dielectric material, preferably silicon oxide deposited by a high density plasma (HDP) or other CVD process. Fill layer 161 is then planarized, by, for example, chemical mechanical polishing (CMP) or etchback until at least the top surfaces of layer 112 are exposed, as in FIG. 6*b*, creating fill regions 161. Some of the silicon can be removed as well to ensure good across-wafer silicon exposure.

To improve uniformity across the wafer, it may be preferable to avoid overfilling gaps when depositing insulating fill layer 161 and thus minimizing the amount of CMP required to planarize the surface. This is fully described in Vyvoda et al., U.S. patent application Ser. No. 09/776,000, "Structure and Method for Wafer Comprising Dielectric and Semiconductor," filed Feb. 2, 2001, which is hereby incorporated by reference.

Figure 6C:
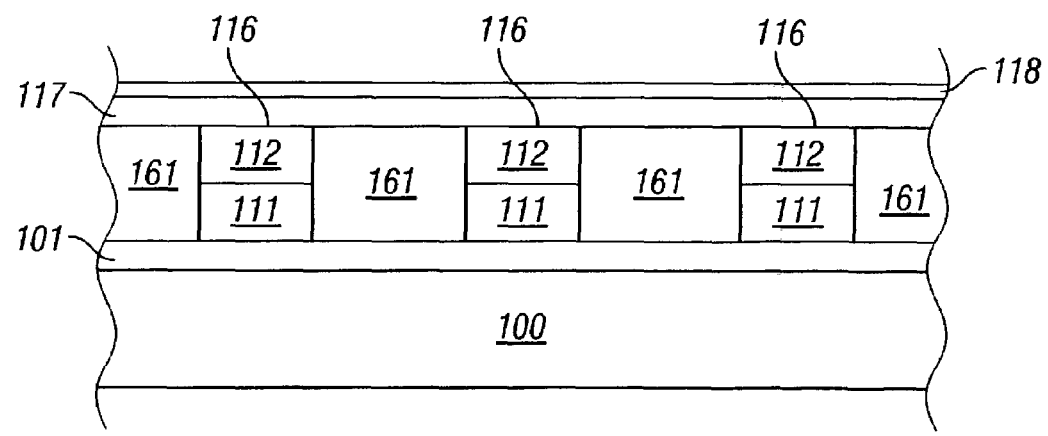

A first metal layer 117 is deposited on the lines 116 and fill regions 161. The metal layer 117 can be cobalt, platinum, nickel, chromium, or niobium, but in preferred embodiments is cobalt. For simplicity, the layer will be referred to as cobalt layer 117, though the other metals named may be used instead. Cobalt layer 117 may be deposited by any suitable deposition method, such as sputtering, to a thickness of, for example, about 20 to about 50 nm, preferably about 30 nm. An optional capping layer 118 is deposited on cobalt layer 117, as in FIG. 6*c*. The capping layer 118 may be sputter-deposited titanium, titanium nitride, or any other suitable material. The capping layer assists in the subsequent conversion of the cobalt layer to cobalt silicide. If desired, the capping layer can be omitted.

Figure 6D:
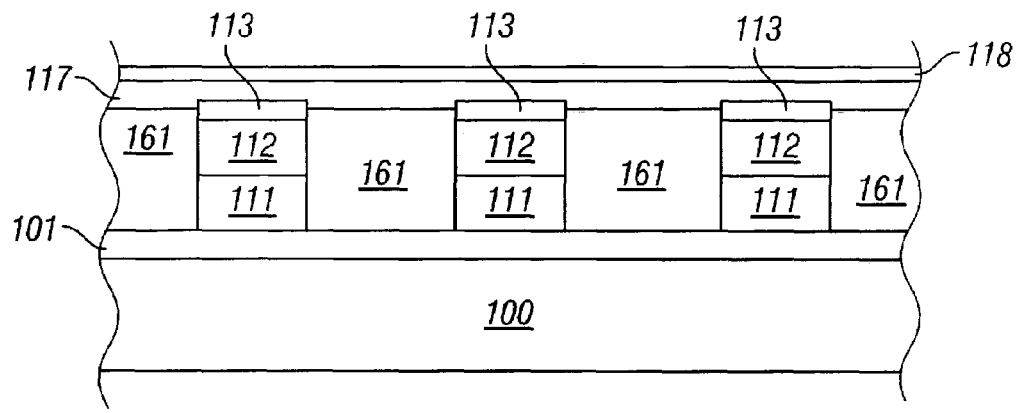

The cobalt layer 117 is annealed at a suitable temperature to react portions of the cobalt layer with the polysilicon of layer 112 to form silicide layer 113, as shown in FIG. 6*d*. For example, the anneal may be carried out in a rapid thermal annealing system at about 400 to about 700 degrees C. for about 20 to about 100 seconds, preferably at about 440 degrees C. for about 60 seconds. A portion of silicide layer 113 extends above the top surface of fill regions 161, while a portion of polysilicon layer 112 is consumed by the silicide formation.

Figure 6E:
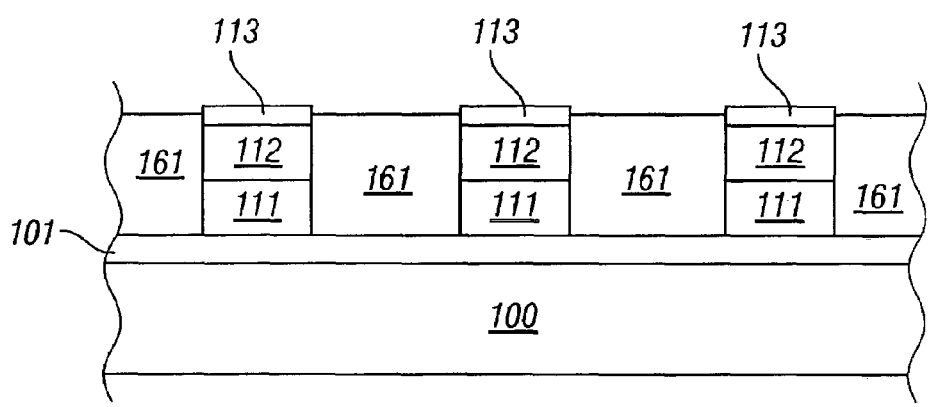

The capping layer 118 and unreacted portions of cobalt layer 117 are selectively removed by a selective etch, as shown in FIG. 6*e*. Any etching medium which selectively etches the capping layer and the cobalt layer over the cobalt silicide layer may be used. Preferably, selective wet etching is used.

Silicide layer 113 is then annealed at a second temperature higher than the temperature used in the first anneal to homogenize the cobalt silicide layer. For example, the anneal may be carried out in a rapid thermal anneal system at about 550 degrees to about 800 degrees C. for about 30 to about 60 seconds, preferably at about 740 degrees for about 40 seconds. The second anneal step may be omitted if the first anneal step is carried out at a temperature above 700 degrees. Higher temperatures may also be used for the first anneal, for example 1000 to 2000 degrees C., if the second anneal is omitted.

Figure 6F:
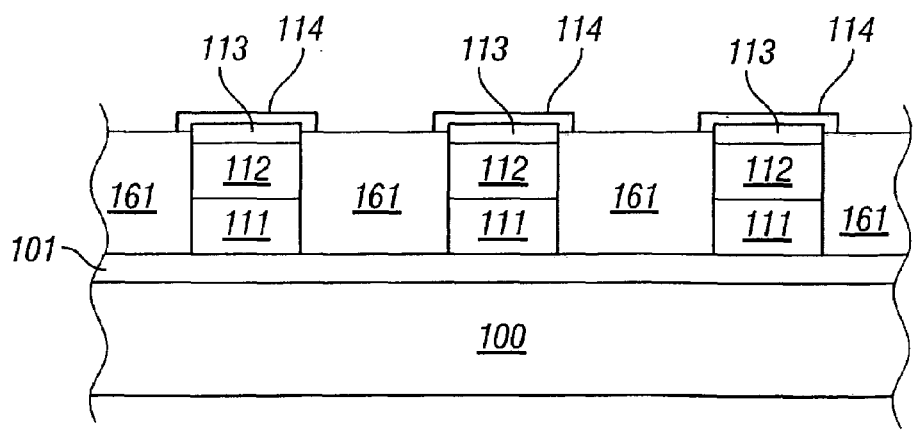

Antifuse layer 114 is selectively thermally grown on silicide layer 113 by exposing silicide layer 113 to an oxygen-containing ambient at a temperature above room temperature, as shown in FIG. 6*f*. Preferably silicide layer 113 is exposed to oxygen gas in a rapid thermal anneal system at about 600 to about 850 degrees C. for about 20 to about 60 seconds, preferably at about 700 degrees to about 800 degrees C. for about 20 to about 30 seconds. Alternatively, a steam ambient (wet oxidation) may be used with a temperature of about 800 to about 1000 degrees C. The growth of thin silicon oxide layers on a cobalt silicide layer by annealing the cobalt silicide layer in an oxygen ambient is described, for example, in R. Tung, Appl. Phys. Lett., 72 (20) (1998) 2358-60; S, Mantl, et al., Appl. Phys. Lett., 67 (23) (1995) 3459-61 and I. Kaendler, et al., J. Appl. Phys., 87 (1) (2000) 133-39, incorporated herein by reference in their entirety.

The antifuse layer 114 is formed on the top surface of layer 113 and on portions of side surfaces of layer 113 that extend above fill regions 161. Silicon oxide layers may be grown on platinum, nickel, chromium, and niobium silicide layers by a similar method.

Each level of wordline rails 110 thus consists of layers 111, 112, 113 and 114. In FIG. 5, wordline rails 110 are substantially parallel first rails extending in a first direction.

Figure 7A:
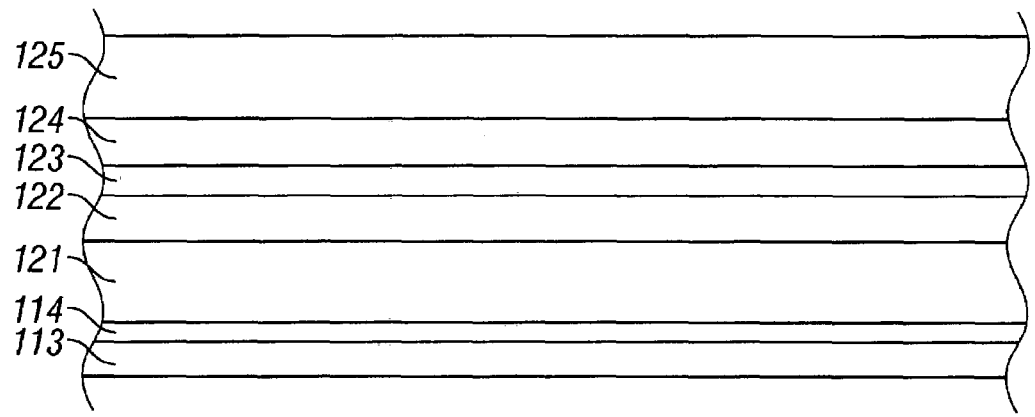
FIGS. 7a through 7d illustrate stages of fabrication of the memory of the present invention.

Next formation of the second rails, which are bitline rails, begins. Turning to FIG. 7*a*, a layer of lightly doped or intrinsic polysilicon 121 is deposited by any method known in the art over silicide layer 113 and antifuse 114 and intervening dielectric fill 161. (Note that at this point silicide layers 113 and antifuse 114 are at the top of underlying parallel wordline rails separated by dielectric fill regions 161. In FIGS. 7*a* through 7*d*, the underlying wordline rail is shown as if cut along its length, roughly perpendicular to the view of the same rails just formed in FIG. 6*f*.) If layer 121 is lightly doped, it can be doped by any known doping method, but is preferably in situ doped with an n-type dopant, such as phosphorus, though a p-type dopant may be used instead, or this layer may be intrinsic silicon.

Note that when polysilicon layer 121 has been patterned and etched into rails, as will be described later, with silicide layer 113 and antifuse layer 114 it will form portions of first-type Schottky diodes. The formation of the portions of first-type Schottky diodes just described uses techniques more fully described in Herner. An exemplary technique is drawn from Herner and described here, but no teaching from Herner to create the layers of this diode is intended to be excluded, and all teachings from that application describing how to create layers of this diode can be used.

Heavily doped polysilicon layer 122 is formed over lightly doped layer 121. Layer 122 can be formed by any deposition and doping method known in the art. The polysilicon can be deposited and then doped, but is preferably doped in situ. The dopant is preferably an n-type dopant such as phosphorus, though a p-type dopant can be used. The conductivity type of this layer should be the same as that of lightly doped or intrinsic layer 121. If layer 121 is intrinsic and behaves as though slightly n-type, layer 122 should be heavily doped n-type.

Conductive layer 123 is formed on heavily doped polysilicon layer 122. It can be of any conductive material, preferably a layer of titanium nitride on a layer of titanium silicide, and can be formed by any method known in the art. In a preferred embodiment, about 250 angstroms of titanium is deposited by sputtering, for example by PVD. Next about 100 angstroms of titanium nitride is deposited, also by sputtering. An anneal serves to silicide the titanium, creating titanium silicide. The anneal can be performed at, for example, 675 degrees C. for about 60 seconds. This anneal may not render the titanium silicide all C54 phase (the lowest resistivity phase), but instead the higher-resistivity C49 phase. Another anneal performed after all layers are built can complete the conversion to C54.

Heavily doped polysilicon layer 124 is formed on conductive layer 123. It can be formed using the same materials and dopants as heavily doped polysilicon layer 122. It can have the same or the opposite conductivity type.

Lightly doped polysilicon layer 125 is formed on heavily doped polysilicon layer 124 using any known deposition and doping techniques. Its thickness, dopant, and dopant concentration are preferably the same as those of lightly doped polysilicon layer 121. The conductivity type of this layer should be the same as that of heavily doped layer 124. Layers 121 through 125 at this point are shown in FIG. 7a.

Figure 7B:
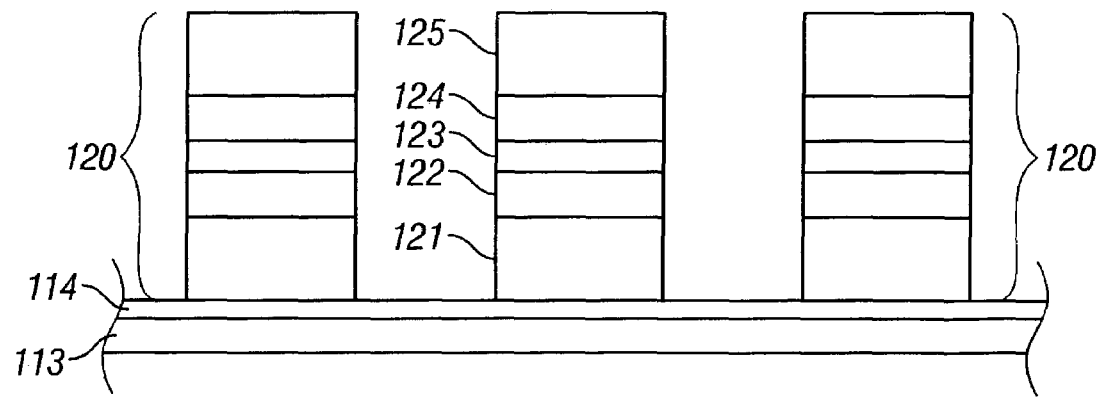
Figure 7C:
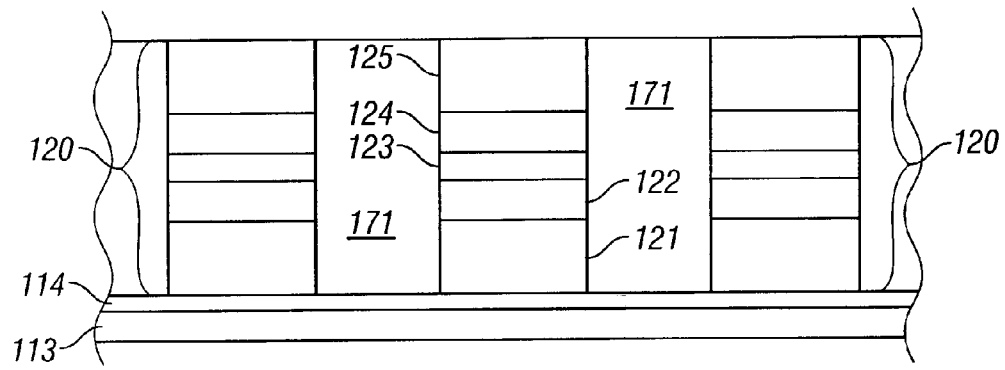

Turning to FIG. 7b, layers 121, 122, 123, 124, and 125 are patterned and etched, using any known photolithography and etch techniques, into substantially parallel rails 120 extending in a second direction different from the first direction of wordlines 110 (in FIG. 5), the first rails; preferably the second direction is substantially perpendicular to the first direction. Next insulating fill layer 171 is deposited over and between rails 120, preferably avoiding overfill that will require excessive planarization. Fill layer 171 is any dielectric material, preferably silicon oxide deposited by an HDP or other CVD process. Fill layer 171 is then planarized, by, for example, CMP or etchback until at least the top surfaces of layer 125 are exposed, as in FIG. 7c.

Figure 7D:
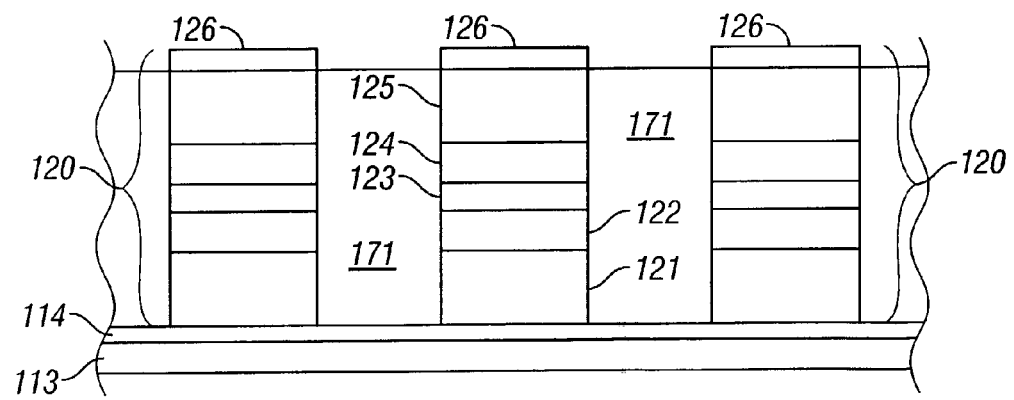

Antifuse layer 126 is grown on lightly doped or intrinsic silicon layer 125 as in FIG. 7d. Antifuse layer 126 is preferably thermally grown using any method known in the art. The antifuse grows only on the rails 120, not on the intervening fill. Antifuse layer 126 is the top layer of bitlines 120. Alternately, antifuse 126 can be deposited. In this case it will form a continuous blanket, rather than being present only on the top of bitlines 120.

In FIG. 5, bitline rails 120 are substantially parallel second rails extending in a second direction different from the first direction of the first rails, which are wordline rails 110. As in FIG. 5, a plurality of third rails can be formed over second the second rails. These third rails are wordline rails 130, which comprise the same layers as wordline rails 110.

If a plurality of bitline rails are the top rails in a monolithic three dimensional memory array, antifuse layer 126 and polysilicon layers 125 and 124 can be omitted.

Zias

In monolithic three dimensional memory arrays of the type created according to the present invention, vertical interconnects, termed zias (analogous to vias in conventional two dimensional memories), may be used to connect different levels of memory and to connect memory levels to substrate circuitry.

Prior art zia formation in monolithic three dimensional memories is described in Cleeves et al., U.S. patent application Ser. No. 09/746,341, filed Dec. 22, 2000, hereby incorporated by reference.

Figure 8A:
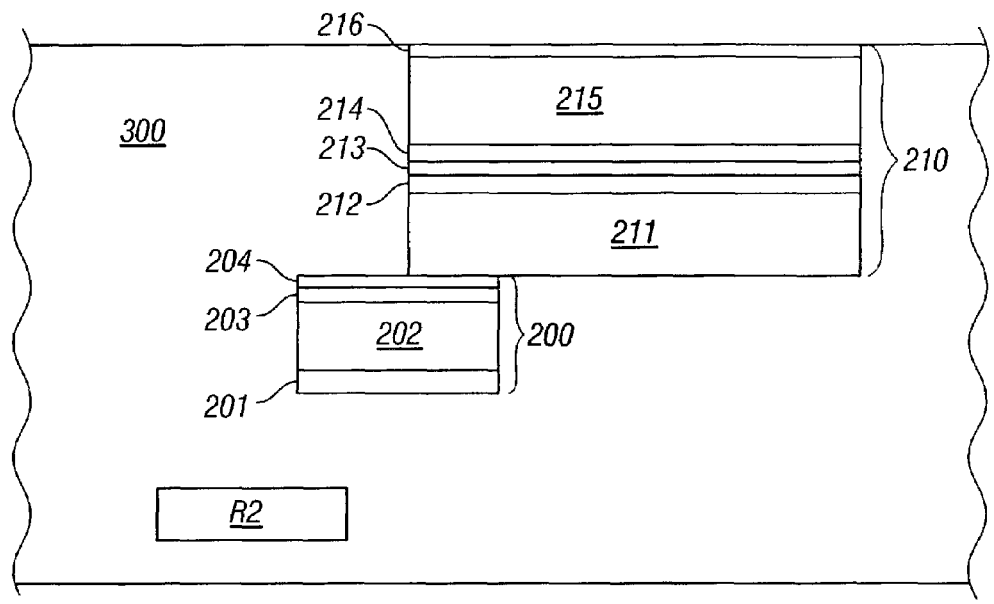
FIGS. 8a through 8d illustrate formation of vertical interconnects.

FIG. 8a shows a wordline pad 200 and overlying bitline pad 210 according to the present invention. These pads are typically formed outside the array footprint. The pads are at the same height as corresponding wordline and bitline rails in a monolithic three dimensional memory array, and are formed by the same process steps. Connections to the array are formed as desired.

The structure is shown when the next level of wordline rails and corresponding pads, along with zias connecting them to the existing bitline and wordline pads, are about to be formed. Dielectric 300, preferably silicon dioxide, fills spaces adjacent to pads 200 and 210. Circuitry formed in the substrate below the wordline pad 200 and bitline pad 210 can be contacted through contact pad R2.

Note that dielectric 300 comprises 1) the intermetal dielectric over contact pad R2, 2) dielectric gap fill deposited over and between wordline pad 200 and wordline rails formed at the same time as wordline pad 200, and 3) dielectric gap fill deposited over and between bitline pad 210 and bitlines formed at the same time as bitline pad 210. These three dielectrics are formed at separate times by separate processes, for example deposition, though all preferably comprise silicon oxide.

Wordline pad 200 comprises layers 201, 202, 203, and 204, which correspond to layers 111, 112, 113, and 114, respectively, in wordlines 110, 130, and 150 in FIG. 5. These layers are preferably titanium nitride layer 201, heavily doped polysilicon layer 202, cobalt silicide layer 203, and antifuse layer 204.

Bitline pad 210 comprises layers 211 through 216, which correspond to layers 121 through 126, respectively, in bitlines 120, 140, and 160 in FIG. 5. These layers are preferably lightly doped silicon layer 211, heavily doped silicon layer 212, conductive layer 213, heavily doped silicon layer 214, lightly doped silicon layer 215, and antifuse 216.

The top layer of the bitline pad 210 and its corresponding bitlines is antifuse 216. An etch must be performed to create a void for the zia. One approach would be to deposit and pattern photoresist over antifuse 216, etch, and remove the photoresist. The photoresist would need to be deposited over the entire array, not just the pads. If photoresist is deposited directly on top of antifuse 216, however, its removal after the etch is complete could damage antifuse 216 within the memory array. Damage to the antifuse layer will adversely affect function of memory cell.

Figure 8B:
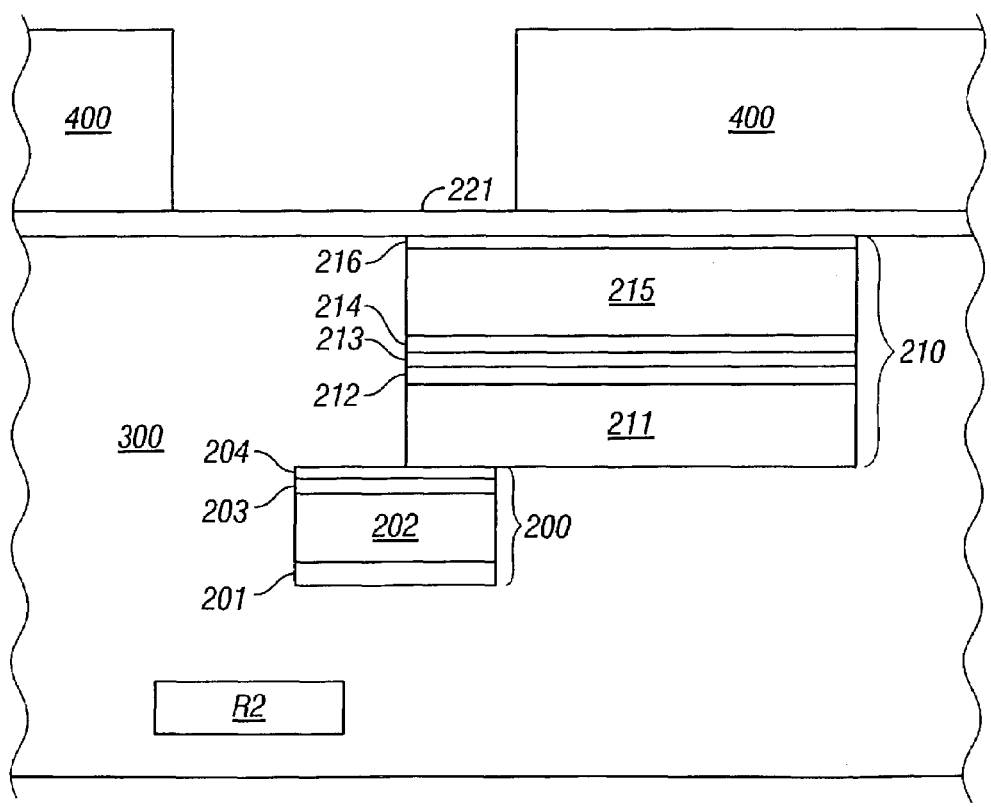

To avoid damage to the fragile antifuse 216 that could be caused by removing photoresist, a hard mask of titanium nitride 221 is deposited instead, as shown in FIG. 8b. Titanium nitride layer 221 can be deposited by any method that will not harm the antifuse beneath it (non-biased PVD, for example) and can be from about 100 to about 1000 angstroms thick, preferably about 300 angstroms thick. Titanium nitride layer 221 will become the first part of the titanium nitride layer at the bottom of the next wordline pad about to be formed.

To create the contact void where the zia is to be formed, the titanium nitride layer 221 and the dielectric 300 need to be etched. This can be done using any pattern and etch technique. For example, photoresist 400 can be deposited and patterned atop titanium nitride layer 221, as in FIG. 8b.

In one embodiment, a titanium nitride etch can be performed in one chamber, then a silicon oxide etch can be performed in a second chamber. Preferably, titanium nitride and silicon oxide are etched in a single chamber.

Figure 8C:
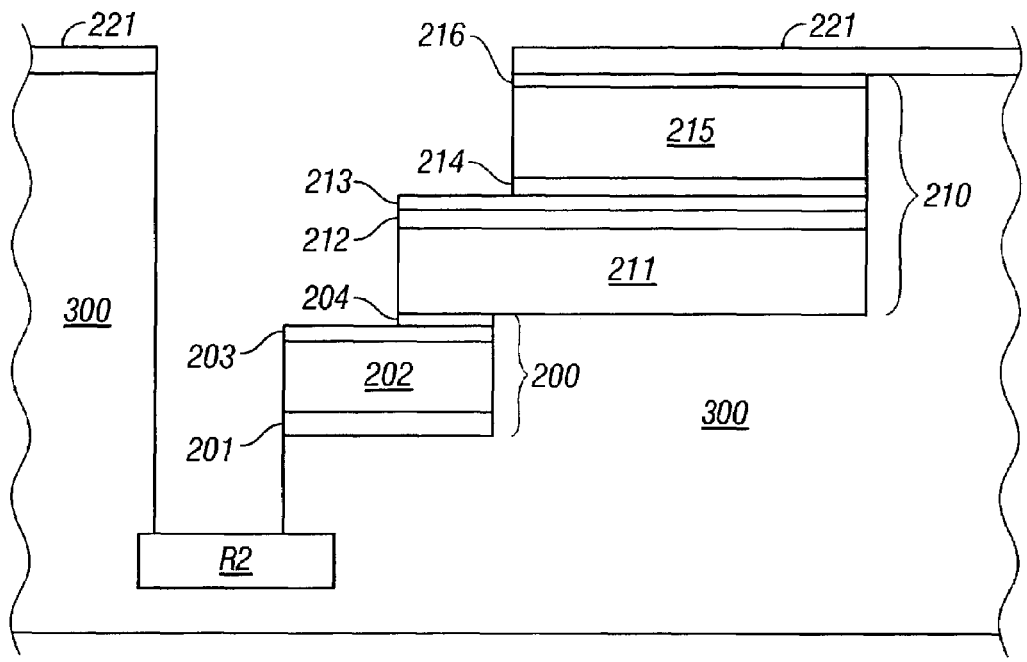

In addition, it is advantageous to etch lightly doped polysilicon layer 215 and heavily doped polysilicon layer 214 in the contact void. It will be seen, in FIG. 8c, that in the region not protected by photoresist, a titanium nitride etch etches titanium nitride layer 221, a silicon oxide etch etches dielectric 300 in the contact void and antifuses 216 and 204, and a silicon etch etches polysilicon layers 215 and 214. Once the etches are complete, conductor 213 in the middle of bitline pad 210 is exposed, as is cobalt silicide layer 203 in wordline pad 200. Both of these layers will provide low-resistance contacts for the zia to be formed.

Figure 8D:
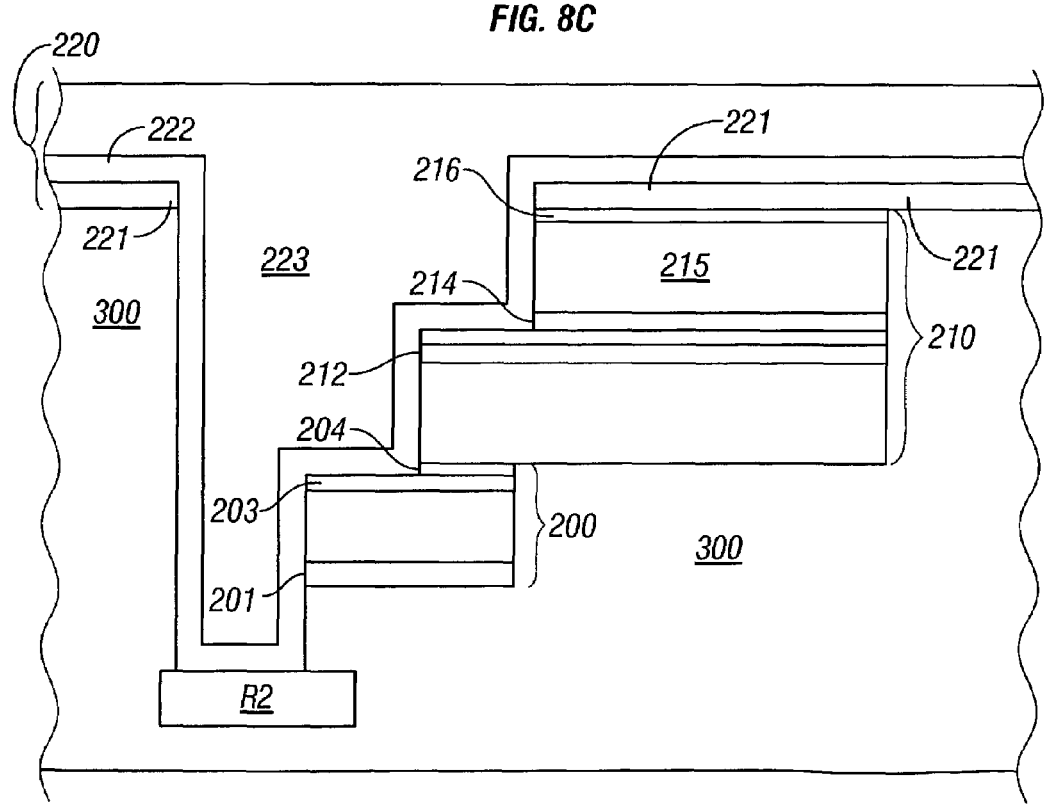

Titanium nitride layer 221 remains after the pattern and etch. A second titanium nitride film 222 can be deposited by any known method that will reach the bottom of a high-aspect ratio gap, for example ionized metal plasma, PVD, or CVD; it will simultaneously line the volume etched for the zia and, together with the underlying titanium nitride layer 221, form the bottom layer of wordline pad 220 to be formed. Next heavily doped polysilicon layer 223 is deposited, in a single deposition filling the zia and forming the heavily doped polysilicon layer 223 of wordline pad 220, as shown in FIG. 8d.

Formation of wordline pad 220 and its corresponding wordline continues as usual: In a preferred embodiment it may be patterned and etched, and the gaps between rails filled and planarized. Cobalt is deposited over the polysilicon and dielectric fill, silicided, the unreacted cobalt removed, and the antifuses grown to complete wordline pad 220 and corresponding wordlines. One sidewall of the zia has a stair-step profile.

Alternately, the pads need not be staggered to form the landing pads shown in FIG. 8a through FIG. 8d, and more conventional contacts can be formed instead, without a sidewall having a stair-step profile.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A nonvolatile memory array comprising:
a first memory cell comprising portions of a first-type Schottky diode; and
a second memory cell comprising portions of a second-type Schottky diode wherein:
portions of the first-type Schottky diode comprise a first metal and the portions of the second-type Schottky diode comprise a second metal different from the first metal.

2. The memory array of claim 1 wherein the first metal is a silicide.

3. The memory array of claim 1 wherein the second metal does not reduce oxides.

4. The memory array of claim 3 wherein the second metal does not reduce silicon oxide.

5. The memory array of claim 1 wherein:
the portions of the first-type Schottky diode comprise a first antifuse; and
the portions of the second-type Schottky diode comprise a second antifuse.

6. The memory array of claim 5 wherein the first antifuses are grown.

7. The memory array of claim 6 wherein:
the first antifuse is over the first metal in the first-type Schottky diode; and
the second metal is over the second antifuse in the second-type Schottky diode.

8. The memory array of claim 6 wherein
the portions of second-type Schottky diode further comprise a second semiconductor and
the Schottky barrier height between the second semiconductor and the second metal is between 0.3 and 0.75 electron volts.

9. The memory array of claim 8 wherein the second metal is titanium nitride, tantalum nitride, or tungsten nitride.

10. The memory array of claim 9 wherein the second metal is titanium nitride.

11. The memory array of claim 10 wherein the first metal is cobalt silicide.

12. The memory array of claim 9 wherein the memory array is a monolithic three dimensional memory array.

13. The memory array of claim 12 wherein the monolithic three dimensional memory array comprises:
a first memory level over a substrate; and
a second memory level over the first memory level, wherein the first memory level comprises the first memory cell and the second memory level comprises the second memory cell.

14. A monolithic three dimensional memory array comprising:
a plurality of incipient first-type Schottky diodes, each comprising a first metal which is a silicide; and
a plurality of incipient second-type Schottky diodes, each comprising a second metal different from the first metal.

15. The memory array of claim 14 wherein each of the plurality of incipient first-type Schottky diodes further comprises:
a first layer of lightly doped or intrinsic silicon; and
a first antifuse, wherein the first metal and first silicon layer are separated by the first antifuse.

16. The memory array of claim 15 wherein the first antifuses are grown.

17. The memory array of claim 16 wherein each of the plurality of incipient second-type Schottky diodes further comprises:
a second layer of lightly doped or intrinsic silicon; and
a second antifuse, wherein the second silicon layer and the second metal are separated by the second antifuse.

18. The memory array of claim 17, further comprising:
a plurality of substantially parallel first rails extending in a first direction above a substrate; and
a plurality of substantially parallel second rails extending in a second direction, different from the first direction, over the first rails; wherein:
the first rails comprise the first metal of the plurality of incipient first-type Schottky diodes; and
the second rails comprise the first layers of lightly doped intrinsic silicon of the plurality of incipient first-type Schottky diodes.

19. The memory array of claim 18, further comprising:
a plurality of substantially parallel third rails extending in the first direction, over the second rails; wherein:
the second rails comprise the second layers of lightly doped or intrinsic silicon of the plurality of incipient second-type Schottky diodes; and
the third rails comprise the second metal of the plurality of incipient second-type Schottky diodes.

20. The memory array of claim 19 wherein the first rails further comprise the first antifuses of the plurality of incipient first-type Schottky diodes.

21. The memory array of claim 20 wherein the second rails further comprise the second antifuses of the plurality of incipient second-type Schottky diodes.

22. The memory array of claim 21 wherein the first metal is cobalt silicide.

23. The memory array of claim 22 wherein the second metal is titanium nitride, tantalum nitride, or tungsten nitride.

24. The memory array of claim 23 wherein the second layers of lightly doped or intrinsic silicon comprise polysilicon.

25. The memory array of claim 24 wherein the first layers of lightly doped or intrinsic silicon comprise polysilicon.

26. The memory array of claim 25 wherein the first layers of silicon comprise lightly doped n-type silicon.

27. The memory array of claim 25 wherein the first layers of silicon comprise intrinsic silicon.

28. The memory array of claim 25 wherein at least one antifuse comprises silicon oxide.

29. A memory cell comprising:
a layer of lightly doped or intrinsic silicon;
an antifuse in contact with the silicon; and a layer of titanium nitride in contact with the antifuse, wherein the antifuse is above the silicon and the titanium nitride is above the antifuse.

30. A method for making a monolithic three dimensional memory array comprising:
forming a plurality of substantially parallel first rails comprising first metal layers adjacent to first antifuses;
forming a plurality of substantially parallel second rails over the first rails, said second rails comprising:
first layers of lightly doped or intrinsic silicon; and
second layers of lightly doped or intrinsic silicon over the first silicon layers; and
forming a plurality of substantially parallel third rails over the second rails, said third rails comprising second metal layers adjacent to second antifuses, wherein the second metal of the second metal layers is different from the first metal of the first metal layers.

31. The method of claim 30 wherein the first metal is a silicide.

32. The method of claim 31 wherein the first metal layers and first layer of lightly doped or intrinsic silicon form incipient first-type Schottky diodes separated by the first antifuses.

33. The method of claim 32 wherein the second layers of lightly doped or intrinsic silicon and the second metal layers form incipient second-type Schottky diodes separated by the second antifuses.

34. The method of claim 33 wherein the first antifuses are grown.

35. A monolithic three dimensional memory array formed over a substrate comprising odd and even levels of memory above a substrate, wherein:
odd memory levels comprise portions of first-type Schottky diodes comprising a first metal; and
even memory levels comprise portions of second-type Schottky diodes comprising a second metal different from the first metal.

36. The monolithic three dimensional memory array of claim 35 wherein
the first metal is a silicide; and
the second metal is titanium nitride, tantalum nitride, or tungsten nitride.

37. The monolithic three dimensional memory array of claim 36 wherein, when the portions of first-type Schottky diodes function as Schottky diodes, current flows substantially up in a vertical direction away from the substrate.

38. The monolithic three dimensional memory array of claim 37 wherein, when the portions of second-type Schottky diodes function as Schottky diodes, current flows substantially down in a vertical direction toward the substrate.

39. A memory array comprising:
portions of a first-type Schottky diode comprising a first semiconductor portion over a first metal portion, the first semiconductor portion and first metal portions separated by a first antifuse; and
portions of a second-type Schottky diode comprising a second metal portion over a second semiconductor portion, the second metal portion and the second semiconductor portion separated by a second antifuse,
wherein both antifuses are grown,
wherein the array comprises a monolithic three dimensional memory array,
wherein the first metal is different from the second metal.

40. A memory array comprising:
a plurality of Schottky diodes or incipient Schottky diodes; and
a vertical interconnect having a sidewall with a stair-step profile.

41. The memory array of claim 40 wherein the plurality of Schottky diodes or incipient Schottky diodes are vertically oriented.

42. The memory array of claim 41 wherein the memory array is a monolithic three dimensional memory array.

43. The memory array of claim 41 wherein the plurality of Schottky diodes or incipient Schottky diodes comprises portions of first-type Schottky diodes and portions of second-type Schottky diodes,
the first-type Schottky diodes comprising first semiconductor portions over first metal portions; and
the second-type Schottky diodes comprising second metal portions over second semiconductor portions.

44. The memory array of claim 43 wherein
the first metal portions comprise a first metal,
the second metal portions comprise a second metal, and
the first metal is different from the second metal.

45. The memory array of claim 44 wherein the memory array is a monolithic three dimensional memory array.

* * * * *